United States Patent
Imai et al.

(10) Patent No.: US 10,229,841 B2
(45) Date of Patent: Mar. 12, 2019

(54) WAFER DRYING APPARATUS AND WAFER DRYING METHOD

(71) Applicant: EBARA CORPORATION, Tokyo (JP)

(72) Inventors: Masayoshi Imai, Tokyo (JP); Satomi Hamada, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 254 days.

(21) Appl. No.: 15/186,352

(22) Filed: Jun. 17, 2016

(65) Prior Publication Data

US 2016/0372344 A1  Dec. 22, 2016

(30) Foreign Application Priority Data

Jun. 22, 2015 (JP) .................................. 2015-124538

(51) Int. Cl.
| | |
|---|---|
| F26B 5/12 | (2006.01) |
| H01L 21/67 | (2006.01) |
| F26B 21/14 | (2006.01) |
| H01L 21/677 | (2006.01) |
| F26B 5/16 | (2006.01) |

(52) U.S. Cl.
CPC .......... *H01L 21/67034* (2013.01); *F26B 5/12* (2013.01); *F26B 5/16* (2013.01); *F26B 21/14* (2013.01); *H01L 21/67028* (2013.01); *H01L 21/6776* (2013.01); *F26B 2200/12* (2013.01)

(58) Field of Classification Search
CPC ...... F26B 5/12; F26B 21/14; H01L 21/67034; H01L 21/67028; H01L 21/6776
USPC ........................................................ 34/426
See application file for complete search history.

(56) References Cited

U.S. PATENT DOCUMENTS

| | | | | |
|---|---|---|---|---|
| 3,931,684 A | * | 1/1976 | Turnbull | F26B 5/00 34/242 |
| 4,143,468 A | * | 3/1979 | Novotny | B05D 3/067 250/398 |
| 5,535,525 A | * | 7/1996 | Gardner | F26B 21/145 134/105 |
| 5,551,165 A | * | 9/1996 | Turner | F26B 5/14 134/902 |

(Continued)

FOREIGN PATENT DOCUMENTS

| | | |
|---|---|---|
| JP | H10-050650 A | 2/1998 |
| JP | 10-270392 A | 10/1998 |

(Continued)

OTHER PUBLICATIONS

Singapore Patent Application No. 10201605035V; Search Report; dated May 22, 2018; 3 pages.

*Primary Examiner* — Stephen M Gravini

(74) *Attorney, Agent, or Firm* — Baker & Hostetler LLP

(57) ABSTRACT

A wafer drying apparatus capable of preventing formation of a watermark is disclosed. The wafer drying apparatus includes: a conveying mechanism configured to convey a wafer in a drying chamber; an inert-gas jet nozzle disposed above the conveying mechanism and configured to form a descending jet of an inert gas; and a liquid suction nozzle disposed upstream of the inert-gas jet nozzle with respect to a conveying direction of the wafer. A distance between the liquid suction nozzle and a surface of the wafer when the wafer is being conveyed by the conveying mechanism is in a range of 1 mm to 2 mm.

8 Claims, 7 Drawing Sheets

(56) References Cited

U.S. PATENT DOCUMENTS

| | | | | |
|---|---|---|---|---|
| 5,671,544 | A * | 9/1997 | Yokomizo | F26B 21/145 34/169 |
| 5,694,701 | A * | 12/1997 | Huelsman | F26B 3/20 34/421 |
| 5,803,970 | A * | 9/1998 | Tateyama | G03F 7/162 118/319 |
| 5,881,476 | A * | 3/1999 | Strobush | F26B 13/10 34/210 |
| 5,950,328 | A * | 9/1999 | Ichiko | H01L 21/67034 34/364 |
| 5,956,859 | A * | 9/1999 | Matsumoto | H01L 21/67034 34/208 |
| 6,067,727 | A * | 5/2000 | Muraoka | H01L 21/67034 34/317 |
| 6,108,928 | A * | 8/2000 | Park | H01L 21/67034 134/902 |
| 6,108,932 | A * | 8/2000 | Chai | H01L 21/67034 34/245 |
| 6,131,588 | A * | 10/2000 | Kamikawa | B08B 3/08 134/102.3 |
| 6,158,141 | A * | 12/2000 | Asada | H01L 21/67034 134/25.4 |
| 6,212,789 | B1 * | 4/2001 | Kato | H01L 21/67051 134/902 |
| 6,271,149 | B1 * | 8/2001 | Kondo | H01L 21/67028 430/127 |
| 6,446,358 | B1 * | 9/2002 | Mitsumori | F26B 13/28 34/230 |
| 6,883,248 | B2 * | 4/2005 | Ko | H01L 21/67034 34/78 |
| 6,988,327 | B2 * | 1/2006 | Garcia | C25D 5/22 134/31 |
| 7,065,898 | B2 * | 6/2006 | Kim | H01L 21/67017 34/78 |
| 7,131,217 | B2 * | 11/2006 | Kim | H01L 21/67034 34/630 |
| 7,207,123 | B2 * | 4/2007 | Tanahashi | B01D 53/06 34/80 |
| 7,225,561 | B2 * | 6/2007 | Louw | B05D 3/0446 156/60 |
| 7,353,623 | B2 * | 4/2008 | Asuke | F26B 11/18 34/381 |
| 7,363,729 | B2 * | 4/2008 | Tanaka | F26B 3/28 205/333 |
| 7,648,580 | B2 * | 1/2010 | Nakatsukasa | H01L 21/67028 134/1 |
| 9,857,124 | B2 * | 1/2018 | Obara | F16B 2/02 |
| 2002/0061647 | A1 * | 5/2002 | Kawamoto | H01L 21/02052 438/689 |
| 2004/0250444 | A1 | 12/2004 | Miranda et al. | |
| 2009/0300939 | A1 * | 12/2009 | Kennedy | D06B 23/16 34/474 |
| 2010/0325913 | A1 | 12/2010 | Wang et al. | |
| 2014/0037847 | A1 * | 2/2014 | Vermeer | C23C 16/45551 427/255.28 |
| 2016/0093503 | A1 * | 3/2016 | Tokuri | H01L 21/67028 438/745 |
| 2016/0240413 | A1 * | 8/2016 | Kobayashi | H01L 21/67017 |
| 2016/0365238 | A1 * | 12/2016 | Iwahata | H01L 21/67028 |
| 2016/0372344 | A1 * | 12/2016 | Imai | H01L 21/67034 |

FOREIGN PATENT DOCUMENTS

| | | | |
|---|---|---|---|
| JP | 11-340184 A | 12/1999 | |
| JP | 2001-501030 A | 1/2001 | |
| JP | 2001-170578 A | 6/2001 | |
| JP | 2002-043266 A | 2/2002 | |
| JP | 2002-217151 A | 8/2002 | |
| JP | 2004-022940 A | 1/2004 | |
| JP | 2005-322936 A | 11/2005 | |
| JP | 2006-073573 A | 3/2006 | |
| JP | 2006-247618 A | 9/2006 | |
| JP | 2006-278606 A | 10/2006 | |
| JP | 2010-118644 A | 5/2010 | |
| JP | 2011-009599 A | 1/2011 | |
| JP | 2013-230424 A | 11/2013 | |
| JP | 2013-258397 A | 12/2013 | |
| KR | 20030039318 A | 5/2003 | |
| TW | 200931202 A | 7/2009 | |
| WO | WO 1998/08418 A1 | 3/1998 | |
| WO | WO 2005001355 A1 * | 1/2005 | F26B 5/12 |
| WO | WO 2007/108315 A1 | 9/2007 | |

* cited by examiner

WAFER DRYING APPARATUS AND WAFER DRYING METHOD

CROSS REFERENCE TO RELATED APPLICATION

This document claims priority to Japanese Patent Application Number 2015-124538 filed Jun. 22, 2015, the entire contents of which are hereby incorporated by reference.

BACKGROUND

A CMP process of chemically mechanically polishing a wafer is performed by rubbing a surface of the wafer against a polishing surface while supplying a polishing liquid (i.e., slurry), containing abrasive grains, onto the polishing surface. The abrasive grains and polishing debris remain on the polished wafer. Thus, the wafer is sent to a cleaning chamber and cleaned in the cleaning chamber. Cleaning of the wafer is performed by supplying of a chemical liquid, rinsing of a wafer with pure water, and the like. The cleaned wafer is further transported to a drying chamber, where the wafer is dried.

The polished wafer may have an exposed silicon on its surface. If the wafer is dried with pure water present on the silicon, a watermark is likely to be formed on the surface of the wafer. A mechanism of the formation of the watermark is generally considered as follows. Oxygen present in the air is dissolved in pure water on a wafer, thus inducing dissolution of silicon in the pure water or inducing dissolution of silicon oxide (e.g., $Si_xO_y$) in the pure water. When such pure water is vaporized, silicon hydrate remains as a precipitate on the surface of the wafer. This precipitate is the watermark.

The watermark may cause a defect of devices formed on the wafer or a decrease in performance of the devices. However, once the watermark is formed, it is extremely difficult to remove the watermark from the wafer. Therefore, it is very important to prevent the formation of the watermark when drying a wafer.

SUMMARY OF THE INVENTION

According to embodiments, there are provided a wafer drying apparatus and a wafer drying method capable of preventing formation of a watermark.

Embodiments, which will be described below, relate to a wafer drying apparatus and a wafer drying method capable of drying not only a wafer having a diameter of 300 mm, but also a wafer having a diameter of 450 mm or more, and more particularly to an apparatus and a method for drying a polished wafer by a jet of a gas after cleaning of the polished wafer.

In an embodiment, there is provided a wafer drying apparatus comprising: a conveying mechanism configured to convey a wafer in a drying chamber; an inert-gas jet nozzle disposed above the conveying mechanism and configured to form a descending jet of an inert gas; and a liquid suction nozzle disposed upstream of the inert-gas jet nozzle with respect to a conveying direction of the wafer, a distance between the liquid suction nozzle and a surface of the wafer when the wafer is being conveyed by the conveying mechanism being in a range of 1 mm to 2 mm.

In an embodiment, the liquid suction nozzle has a cylindrical shape.

In an embodiment, the liquid suction nozzle comprises a downstream-side liquid suction nozzle, and the wafer drying apparatus further comprises an upstream-side liquid suction nozzle disposed upstream of the downstream-side liquid suction nozzle.

In an embodiment, a distance between the downstream-side liquid suction nozzle and the upstream-side liquid suction nozzle is one-third to one-half of a diameter of the wafer.

In an embodiment, the inert-gas jet nozzle comprises a slit nozzle which is longer than a diameter of the wafer.

In an embodiment, the inert-gas jet nozzle is inclined at an angle ranging from 45 degrees to 85 degrees with respect to the surface of the wafer when the wafer is being conveyed by the conveying mechanism.

In an embodiment, the inert-gas jet nozzle is located at a distance in a range of 1 mm to 4 mm from the surface of the wafer when the wafer is being conveyed by the conveying mechanism.

In an embodiment, there is provided a wafer drying apparatus comprising: a conveying mechanism configured to convey a wafer in a drying chamber in which an inert gas has been supplied; an inert-gas jet nozzle disposed above the conveying mechanism and configured to form a descending jet of an inert gas toward the wafer; and a liquid suction nozzle disposed upstream of the inert-gas jet nozzle with respect to a conveying direction of the wafer, a distance between the liquid suction nozzle and the inert-gas jet nozzle being in a range of 1 mm to 5 mm.

In an embodiment, there is provided a wafer drying method comprising: forming a descending jet of an inert gas in a drying chamber; sucking a liquid film existing on a surface of a wafer by a liquid suction nozzle to reduce a thickness of the liquid film to 2 mm or less, while conveying the wafer in the drying chamber; and pushing the liquid film out of the wafer by the descending jet of the inert gas.

In an embodiment, the wafer drying method further comprises keeping a concentration of oxygen in the drying chamber at 0.5% or less.

According to the above-described embodiments, liquid (e.g., pure water) on a wafer is sucked by the liquid suction nozzle, thereby forming a thinner liquid film. Therefore, an amount of oxygen dissolved in the liquid film is reduced, and as a result, the formation of the watermark can be prevented. Moreover, since the inert gas is supplied into the drying chamber, the oxygen is expelled from the drying chamber. Therefore, almost no oxygen is dissolved in the liquid film on the wafer. Further, the oxygen present in the thinner liquid film is replaced with molecules of nitrogen or other element that constitutes the inert gas (i.e., the oxygen is purged from the liquid film), so that a concentration of oxygen in the liquid film is further reduced. As a result, the formation of the watermark on the wafer that has been dried can be prevented.

DESCRIPTION OF EMBODIMENTS

Embodiments will now be described with reference to the drawings.

Figure 1:
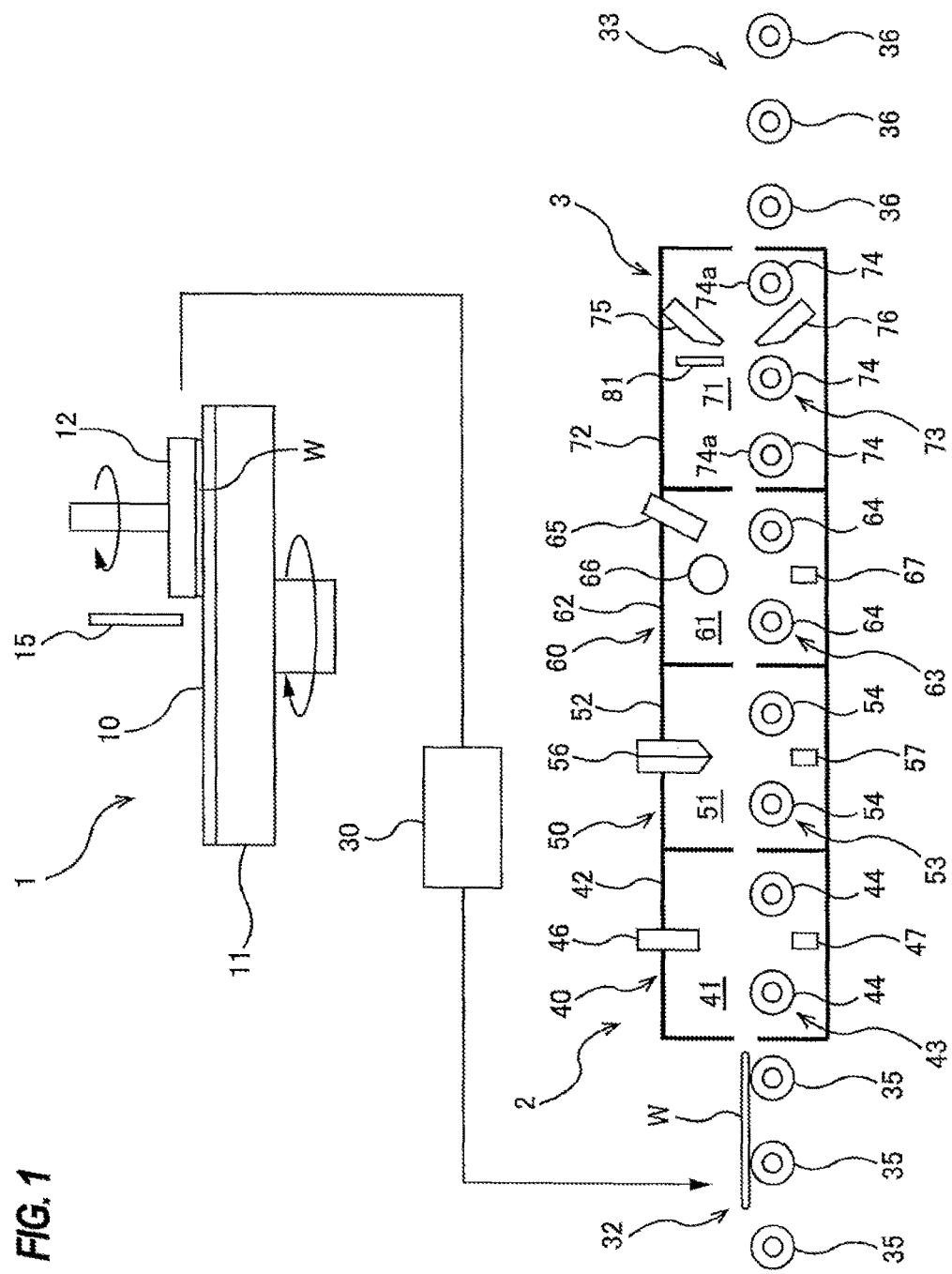
FIG. 1 is a schematic view of an entirety of a wafer processing apparatus which includes a wafer drying apparatus according to an embodiment.

FIG. 1 is a schematic view of an entirety of a wafer processing apparatus which includes a wafer drying apparatus according to an embodiment. The wafer processing apparatus includes a polishing unit 1 for polishing a wafer W, a cleaning unit 2 for cleaning the polished wafer W, and a drying unit 3 for drying the cleaned wafer W. The drying unit 3 is an embodiment of the wafer drying apparatus.

The polishing unit 1 is a polishing apparatus for chemically mechanically polishing a wafer W. The polishing unit 1 includes a polishing table 11 for supporting a polishing pad 10, a polishing head 12 for holding and rotating the wafer W, and a polishing-liquid supply nozzle 15 for supplying a polishing liquid (or slurry) onto the polishing pad 10. An upper surface of the polishing pad 10 provides a polishing surface for polishing a surface of the wafer W. The polishing table 11 is coupled to a table motor (not shown), so that the polishing pad 10 and the polishing table 11 are rotated together by the table motor. The polishing head 12 is configured to be able to hold the wafer W on a lower surface of the polishing head 12 by vacuum suction. The polishing head 12 is coupled to a rotating device (not shown).

Polishing of the wafer W is performed as follows. The polishing liquid is supplied from the polishing-liquid supply nozzle 15 onto the polishing surface of the polishing pad 10, while the polishing table 11 and the polishing pad 10 are rotated. In this state, the polishing head 12, which is holding the wafer W, presses the wafer W against the polishing surface of the polishing pad 10, while the polishing head 12 is rotating. The surface of the wafer W is polished by a mechanical action of abrasive grains contained in the polishing liquid and a chemical action of a chemical component of the polishing liquid. Such polishing unit 1 may be called a CMP (chemical mechanical polishing) apparatus.

The polished wafer W is transported to the cleaning unit 2 by a transporter 30. The transporter 30 has a function to overturn the wafer W. The transporter 30 receives the polished wafer W from the polishing head 12 of the polishing unit 1, overturns the wafer W such that the polished surface faces upward, and transports the wafer W to the cleaning unit 2.

The cleaning unit 2 and the drying unit 3 are coupled in series. An entrance roller conveyer 32 is provided at an entrance of the cleaning unit 2. The wafer W, with its polished surface facing upward, is horizontally placed on the entrance roller conveyer 32 by the transporter 30. An exit roller conveyer 33 is provided at an exit of the drying unit 3.

The entrance roller conveyer 32 has a plurality of rollers 35, which are arranged at predetermined intervals along a conveying direction of the wafer W and are parallel to each other. These rollers 35 are configured to rotate in the same direction in synchronization with each other. The exit roller conveyer 33 has a plurality of rollers 36, which are arranged at predetermined intervals along the conveying direction of the wafer W and are parallel to each other. These rollers 36 are configured to rotate in the same direction in synchronization with each other.

The cleaning unit 2 includes a chemical-liquid cleaning section 40 for cleaning the wafer W by supplying a chemical liquid onto the wafer W, a two-fluid cleaning section 50 for further cleaning the wafer W by delivering a two-fluid jet to the wafer W, an ultrasonic cleaning section 60 for further cleaning the wafer W by irradiating liquid on the wafer W with ultrasonic waves. The chemical-liquid cleaning section 40, the two-fluid cleaning section 50, and the ultrasonic cleaning section 60 are arranged in this order in series.

The chemical-liquid cleaning section 40 includes a structure 42 in which a chemical-liquid cleaning chamber 41 is formed, a roller conveyer 43 disposed in the chemical-liquid cleaning chamber 41, a chemical-liquid supply nozzle 46 for supplying chemical liquid onto an upper surface of the wafer W which is being conveyed by the roller conveyer 43, and a pure-water supply nozzle 47 for supplying pure water onto a lower surface of the wafer W. The roller conveyer 43 has a plurality of rollers 44, which are arranged at predetermined intervals along the conveying direction of the wafer W and are parallel to each other. These rollers 44 are configured to rotate in the same direction in synchronization with each other. The wafer W to be cleaned is delivered into the chemical-liquid cleaning chamber 41 by the entrance roller conveyer 32, and is transferred to the roller conveyer 43. The wafer W is horizontally conveyed in the chemical-liquid cleaning chamber 41 by the roller conveyer 43.

The chemical-liquid supply nozzle 46 is disposed above the roller conveyer 43, and is oriented downwardly. The pure-water supply nozzle 47 is disposed below wafer supporting surfaces which are constructed from top portions of the rollers 44 of the roller conveyer 43. The pure-water supply nozzle 47 is oriented upwardly. The chemical-liquid supply nozzle 46 supplies the chemical liquid onto the upper surface of the wafer W that is being conveyed by the roller conveyer 43, thereby cleaning the upper surface of the wafer W with a chemical component of the chemical liquid. Simultaneously, the pure-water supply nozzle 47 supplies the pure water onto the lower surface of the wafer W that is being conveyed by the roller conveyer 43, thereby cleaning the lower surface of the wafer W with the pure water. The wafer W, which has been cleaned in the chemical-liquid cleaning section 40, is transported to the two-fluid cleaning section 50 by the roller conveyer 43.

The two-fluid cleaning section 50 includes a structure 52 in which a two-fluid cleaning chamber 51, adjacent to the chemical-liquid cleaning chamber 41, is formed, a roller conveyer 53 disposed in the two-fluid cleaning chamber 51, a two-fluid jet nozzle 56 for forming a two-fluid jet directed toward the upper surface of the wafer W that is being conveyed by the roller conveyer 53, and a pure-water supply nozzle 57 for supplying pure water onto the lower surface of the wafer W. The two-fluid jet is a jet of fluid mixture of liquid (e.g., pure water) and gas (e.g., nitrogen gas or air).

The roller conveyer 53 has a plurality of rollers 54, which are arranged at predetermined intervals along the conveying direction of the wafer W and are parallel to each other. These rollers 54 are configured to rotate in the same direction in synchronization with each other. The wafer W that has been cleaned by the chemical-liquid cleaning section 40 is delivered into the two-fluid cleaning chamber 51 by the roller conveyer 43, and is transferred to the roller conveyer 53. The wafer W is horizontally conveyed in the two-fluid cleaning chamber 51 by the roller conveyer 53.

The two-fluid jet nozzle 56 is disposed above the roller conveyer 53, and is oriented downwardly. The pure-water supply nozzle 57 is disposed below wafer supporting surfaces which are constructed from top portions of the rollers 54 of the roller conveyer 53. The pure-water supply nozzle 57 is oriented upwardly. The two-fluid jet nozzle 56 delivers the two-fluid jet to the upper surface of the wafer W that is being conveyed by the roller conveyer 53, thereby removing the polishing liquid (or slurry) and polishing debris from the upper surface of the wafer W. Simultaneously, the pure-water supply nozzle 57 supplies the pure water onto the lower surface of the wafer W that is being conveyed by the roller conveyer 53, thereby cleaning the lower surface of the wafer W with the pure water. The wafer W that has been cleaned in the two-fluid cleaning section 50 is transported to the ultrasonic cleaning section 60 by the roller conveyer 53.

The ultrasonic cleaning section 60 includes a structure 62 in which an ultrasonic cleaning chamber 61, adjacent to the two-fluid cleaning chamber 51, is formed, a roller conveyer 63 disposed in the ultrasonic cleaning chamber 61, an upper liquid supply nozzle 65 for supplying a liquid onto the upper surface of the wafer W being conveyed by the roller conveyer 63, an ultrasonic vibration device 66 configured to generate ultrasonic waves which propagate through the liquid that has been supplied from the upper liquid supply nozzle 65, and a lower liquid supply nozzle 67 for supplying a liquid onto the lower surface of the wafer W being conveyed by the roller conveyer 63. The liquids to be supplied from the upper liquid supply nozzle 65 and the lower liquid supply nozzle 67 may preferably be pure water which can serve as rinsing liquid.

The roller conveyer 63 has a plurality of rollers 64, which are arranged at predetermined intervals along the conveying direction of the wafer W and are parallel to each other. These rollers 64 are configured to rotate in the same direction in synchronization with each other. The wafer W that has been cleaned by the two-fluid cleaning section 50 is delivered into the ultrasonic cleaning chamber 61 by the roller conveyer 53, and is transferred to the roller conveyer 63. The wafer W is horizontally conveyed in the ultrasonic cleaning chamber 61 by the roller conveyer 63.

The upper liquid supply nozzle 65 is disposed above the roller conveyer 63, and is oriented obliquely downwardly. The ultrasonic vibration device 66 is disposed slightly above wafer supporting surfaces of the roller conveyer 63, and is adjacent to the upper liquid supply nozzle 65. When the liquid is supplied from the upper liquid supply nozzle 65 onto the upper surface of the wafer W, a flow of the liquid is formed on the upper surface of the wafer W, and the ultrasonic vibration device 66 contacts the liquid flowing on the wafer W. The ultrasonic vibration device 66, which is in contact with the liquid, generates the ultrasonic waves. The ultrasonic waves propagate through the liquid to reach the upper surface of the wafer W, thereby removing fine particles from the upper surface of the wafer W. Simultaneously, the lower liquid supply nozzle 67 supplies liquid onto the lower surface of the wafer W being conveyed by the roller conveyer 63, thereby cleaning the lower surface of the wafer W with the liquid. The wafer W that has been cleaned in the ultrasonic cleaning section 60 is transported to the drying unit 3 by the roller conveyer 63.

The drying unit 3 is adjacent to the cleaning unit 2. The drying unit 3 is a wafer drying apparatus configured to dry the wafer W which has been cleaned in the cleaning unit 2. The drying unit 3 includes a structure 72 in which a drying chamber 71, adjacent to the cleaning unit 2, is formed, a roller conveyer 73 as a conveying mechanism which conveys the wafer W in the drying chamber 71, an upper inert-gas jet nozzle 75 which is disposed above the roller conveyer 73 and is configured to form a descending jet of an inert gas such as a nitrogen gas, a lower inert-gas jet nozzle 76 which is disposed below wafer supporting surfaces 74a of the roller conveyer 73 and is configured to form an ascending jet of an inert gas such as a nitrogen gas, and a liquid suction nozzle 81 disposed upstream of the upper inert-gas jet nozzle 75 with respect to the conveying direction of the wafer W. The roller conveyer 73, the upper inert-gas jet nozzle 75, the lower inert-gas jet nozzle 76, and the liquid suction nozzle 81 are disposed in the drying chamber 71.

The roller conveyer 73 has a plurality of rollers 74, which are arranged at predetermined intervals along the conveying direction of the wafer W and are parallel to each other. These rollers 74 are configured to rotate in the same direction in synchronization with each other. The wafer W that has been cleaned in the cleaning unit 2 is delivered into the drying chamber 71 by the roller conveyer 63, and is transferred to the roller conveyer 73. The wafer W is horizontally conveyed in the drying chamber 71 by the roller conveyer 73.

Figure 2:
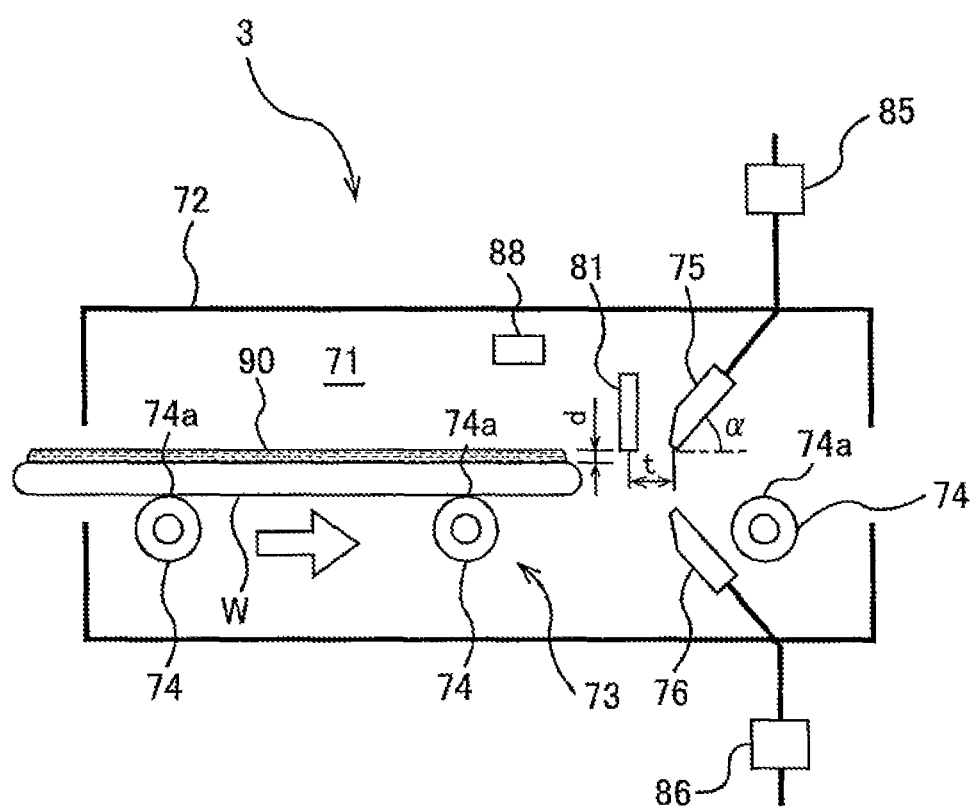
FIG. 2 is a schematic view showing a drying unit which is an embodiment of the wafer drying apparatus.

FIG. 2 is a schematic view showing the drying unit 3 which is an embodiment of the wafer drying apparatus. The upper inert-gas jet nozzle 75 is disposed above the wafer supporting surfaces 74a of the roller conveyer 73, and the lower inert-gas jet nozzle 76 is disposed below the wafer supporting surfaces 74a of the roller conveyer 73. The wafer supporting surfaces 74a of the roller conveyer 73 are constructed from top portions of the rollers 74. The upper inert-gas jet nozzle 75 is oriented obliquely downwardly, while the lower inert-gas jet nozzle 76 is oriented obliquely upwardly. The upper inert-gas jet nozzle 75 is configured to form the descending jet of the inert gas directed toward the upper surface of the wafer W, and the lower inert-gas jet nozzle 76 is configured to form the ascending jet of the inert gas directed toward the lower surface of the wafer W.

An angle α of inclination of the upper inert-gas jet nozzle 75 with respect to the upper surface of the wafer W being conveyed by the roller conveyer 73 is in a range of 45 degrees to 85 degrees, and preferably in a range of 60 degrees to 75 degrees. The angle of inclination of the upper inert-gas jet nozzle 75 is determined from the viewpoint of effectively removing the liquid (e.g., pure water) on the wafer W at a lower flow rate of the inert gas.

The lower inert-gas jet nozzle 76 is also inclined with respect to the lower surface of the wafer W being conveyed by the roller conveyer 73. The lower inert-gas jet nozzle 76 is inclined with respect to the lower surface of the wafer W for the following reason. The liquid is likely to be attached to the lower surface of the wafer W. In order to appropriately remove the attached liquid from the lower surface of the wafer by the jet from the lower inert-gas jet nozzle 76, it is preferable to incline the lower inert-gas jet nozzle 76 with respect to the lower surface of the wafer W at a predetermined angle. An angle of inclination of the lower inert-gas jet nozzle 76 with respect to the lower surface of the wafer W is in a range of 45 degrees to 85 degrees, and preferably in a range of 60 degrees to 75 degrees. Such configuration can prevent the liquid from remaining on the lower surface of the wafer W, and as a result, can prevent a formation of a watermark on the lower surface of the wafer.

A distance between the upper surface of the wafer W on the roller conveyer 73 and the upper inert-gas jet nozzle 75 is in a range of 1 mm to 4 mm. In order to quickly suck the liquid that has been pushed backward by the descending jet of the inert gas, and in order to make a liquid film remaining on the upper surface of the wafer W as thin as possible, the liquid suction nozzle 81 is located near the upper inert-gas jet nozzle 75. More specifically, a distance "t" between the liquid suction nozzle 81 and the upper inert-gas jet nozzle 75 is preferably in a range of 0.5 mm to 10 mm, and more preferably in a range of 1 mm to 5 mm. One of the reasons of this arrangement is to reduce a thickness of an edge of the liquid film when the descending jet of the inert gas impinges on the liquid on the upper surface of the wafer W. Further, since the liquid suction nozzle 81 is located upstream of the upper inert-gas jet nozzle 75, as the wafer W is being conveyed by the roller conveyer 73, the liquid suction nozzle 81 is located outside a periphery of the wafer W before the upper inert-gas jet nozzle 75 is located outside the periphery of the wafer W. If the distance between the liquid suction nozzle 81 and the upper inert-gas jet nozzle 75 is too long, a total amount of liquid remaining on the upper surface of the wafer W, with the liquid suction nozzle 81 located outside the wafer W, is increased. In particular, when a speed of conveying the wafer W is increased in order to reduce a processing time, the jet of the inert gas may not be able to blow the liquid film out from the wafer W. For these reasons, the distance between the liquid suction nozzle 81 and the upper inert-gas jet nozzle 75 is preferably 10 mm or less, and more preferably 5 mm or less. Further, in order to prevent unstable gas flow around the wafer due to a change in the flow of the inert gas upon colliding with the liquid suction nozzle 81, the distance between the liquid suction nozzle 81 and the upper inert-gas jet nozzle 75 is preferably 0.5 mm or more, and more preferably 1 mm or more. Such arrangement can appropriately remove the liquid film on the wafer W, and can therefore prevent the liquid attached to the upper surface of the wafer W from remaining on the wafer after the drying processing.

The upper inert-gas jet nozzle 75 and the lower inert-gas jet nozzle 76 are coupled to flow rate controllers (e.g., mass flow controllers) 85, 86, respectively. Flow rates of the inert gas are controlled by the flow rate controllers 85, 86. The drying chamber 71 is filled with the inert gas supplied from the upper inert-gas jet nozzle 75 and the lower inert-gas jet nozzle 76, so that an inert gas atmosphere is formed in the drying chamber 71. An oxygen concentration measuring device 88 is disposed in the drying chamber 71.

The flow rates of the inert gas to be ejected from the upper inert-gas jet nozzle 75 and the lower inert-gas jet nozzle 76 are controlled to be predetermined values so that a concentration of oxygen in the drying chamber 71 is kept at not more than a predetermined target value. As can be seen from FIG. 1, the drying chamber 71 is in communication with the chemical-liquid cleaning chamber 41, the two-fluid cleaning chamber 51, and the ultrasonic cleaning chamber 61. Therefore, the chemical-liquid cleaning chamber 41, the two-fluid cleaning chamber 51, and the ultrasonic cleaning chamber 61 are filled with the inert gas, as well.

As shown in FIG. 2, the liquid suction nozzle 81 is disposed upstream of the upper inert-gas jet nozzle 75 with respect to the conveying direction (indicated by a white arrow) of the wafer W. The liquid suction nozzle 81 is located slightly above the wafer supporting surfaces 74a of the roller conveyer 73. More specifically, a distance "d" between the liquid suction nozzle 81 and the surface of the wafer W being conveyed by the roller conveyer 73 is in a range of 1 mm to 2 mm. The liquid suction nozzle 81 is provided for sucking the liquid (e.g., pure water) present on the wafer W to reduce a thickness of a film of the liquid (hereinafter referred to as liquid film 90). Further, the thickness of the liquid film 90 can be controlled by a height of the liquid suction nozzle 81 and/or a flow rate of the liquid sucked by the liquid suction nozzle 81. Further, in order to reduce an amount of oxygen in the liquid film 90 which is considered to be a cause of the formation of the watermark, the thickness of the liquid film 90 is preferably 2 mm or less.

In order to allow the liquid film 90 around the liquid suction nozzle 81 to have a thickness of 2 mm or less, in this embodiment, the distance "d" between the liquid suction nozzle 81 and the surface of the wafer W being conveyed by the roller conveyer 73 is set to 2 mm or less. Furthermore, the distance "d" of 2 mm or less enables the liquid film existing around the liquid suction nozzle 81 to have a thickness of 2 mm or less relatively easily. Consequently, the jet of the inert gas, ejected from the upper inert-gas jet nozzle 75, can easily blow the liquid film out from the wafer W.

Further, the distance "d" between the liquid suction nozzle 81 and the wafer W being conveyed at a constant speed by the roller conveyer 73 is preferably 1 mm or more so that the flow of the inert gas does not become unstable around the liquid suction nozzle 81. A liquid film sensor configured to measure the thickness of the liquid film 90 on the wafer W may be provided in the drying chamber 71, so that the height of the liquid suction nozzle 81 and/or the suction flow rate may be controlled so as to keep the thickness of the liquid film 90 at a predetermined target value.

Figure 3:
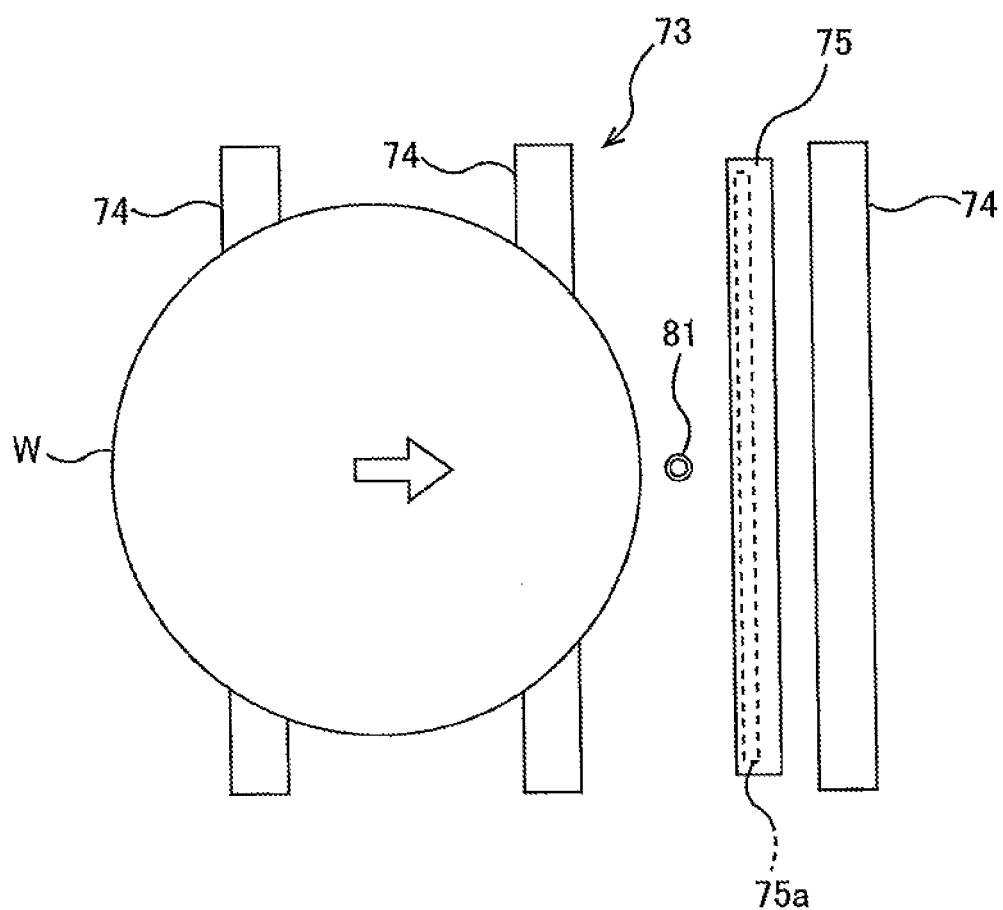
FIG. 3 is a plan view showing a roller conveyer, an upper inert-gas jet nozzle, and a liquid suction nozzle shown in FIG. 2.

FIG. 3 is a plan view showing the roller conveyer 73, the upper inert-gas jet nozzle 75, and the liquid suction nozzle 81 shown in FIG. 2. As shown in FIG. 3, the upper inert-gas jet nozzle 75 comprises a slit nozzle having a slit 75a extending in a direction perpendicular to the conveying direction (indicated by a white arrow) of the wafer W. The slit 75a is an ejection outlet for the inert gas. A length of the slit 75a is longer than a diameter of the wafer W. Therefore, the upper inert-gas jet nozzle 75 can form the jet of inert gas that is wider than the diameter of the wafer W. This wide jet of inert gas can push the liquid present on the entire upper surface of the wafer W. Although not shown in the drawings, the lower inert-gas jet nozzle 76 also comprises a slit nozzle having a slit (or an ejection outlet) which is longer than the diameter of the wafer W.

The liquid suction nozzle 81 is located on a straight line (which is an imaginary line) which extends perpendicularly from a center of the upper inert-gas jet nozzle 75. When the liquid suction nozzle 81 sucks the liquid on the upper surface of the wafer W, a tip of the liquid suction nozzle 81 is in contact with the liquid. At this time, particles, attached to the liquid suction nozzle 81, may be moved into the liquid, and may be attached to the upper surface of the wafer W. Thus, in order to decrease a contact area of the tip of the liquid suction nozzle 81 and the liquid, the liquid suction nozzle 81 has a cylindrical shape, and a bore of the liquid suction nozzle 81 is in a range of 2 mm to 4 mm. The liquid suction nozzle 81 having such a shape and a bore can certainly suck the liquid in consideration of a fluid pressure acting on the liquid around the liquid suction nozzle 81 when the liquid on the wafer W is sucked. As a result, wafer contamination after the drying process can be minimized. Further, in order to prevent wafer contamination, the liquid suction nozzle 81 is preferably made of material which is hardly dissolved in the liquid. For example, the liquid suction nozzle 81 may preferably be made of a fluororesin, such as polytetrafluoroethylene. In one embodiment, the liquid suction nozzle 81 comprises a PFA tube.

Figure 4A:
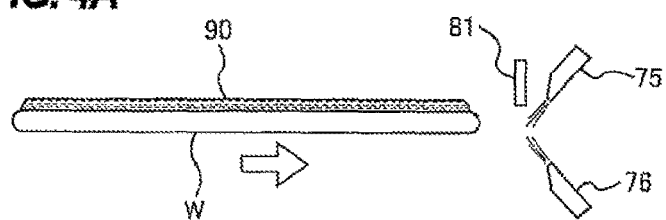
FIG. 4A, FIG. 4B, FIG. 4C, and FIG. 4D are views each showing a manner in which liquid present on an upper surface of a wafer is removed by the liquid suction nozzle and a jet of inert gas.
Figure 4B:
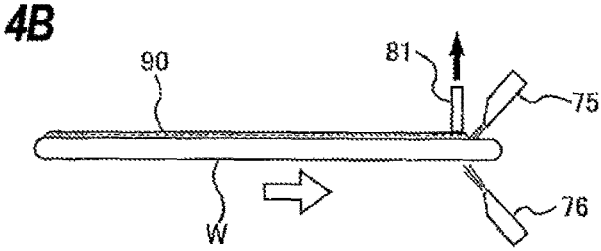

FIGS. 4A through 4D are views each showing a manner in which the liquid present on the upper surface of the wafer W is removed by the liquid suction nozzle 81 and the jet of the inert gas. In FIG. 4A, the wafer W, with the liquid film 90 formed on the upper surface thereof, is conveyed toward the liquid suction nozzle 81 and the inert-gas jet nozzles 75, 76 at a preset speed by the roller conveyer 73. In order to fill the drying chamber 71 with the inert gas, the ejection of the inert gas from the inert-gas jet nozzles 75, 76 is started before the wafer W is transported into the drying chamber 71. In FIG. 4B, the suction of the liquid (liquid film 90) by the liquid suction nozzle 81 is started. Immediately after the suction of the liquid is started, the descending jet of the inert gas, formed by the upper inert-gas jet nozzle 75, pushes the liquid film 90 backward. The ascending jet of the inert gas toward the lower surface of the wafer W is formed by the lower inert-gas jet nozzle 76.

Figure 4C:
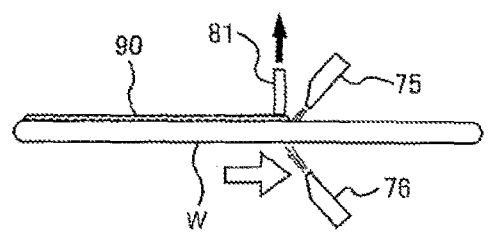
Figure 4D:
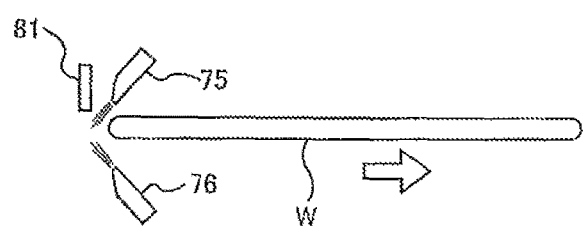

In FIG. 4C, the liquid is sucked by the liquid suction nozzle 81 while the descending jet of the inert gas pushes the liquid film 90 backward as the wafer W advances. In order to enable the liquid suction nozzle 81 to suck the liquid in a manner to keep the thickness of the liquid film 90 at not more than a target value (e.g., 2 mm or less) and in order to improve a throughput, a speed of the wafer W conveyed by the roller conveyer 73 may preferably be in a range of 5 mm/sec to 20 mm/sec. In this manner, since the liquid is sucked by the liquid suction nozzle 81, not only the thickness of the liquid film 90 is reduced, but also an amount of the liquid displaced to the lower surface of the wafer W is reduced. In FIG. 4D, the entirety of the wafer W passes through the descending jet of the inert gas. As a result, the liquid film 90 is forced out of the upper surface of the wafer W by the descending jet of the inert gas.

In the case where the liquid is pure water, the liquid film 90 on the wafer W has a thickness of about 3.8 mm at a maximum, although it depends on a surface condition of the wafer W. According to the above-described embodiment, the liquid (e.g., pure water) on the wafer W is sucked by the liquid suction nozzle 81, and as a result, the liquid film 90 becomes thin. Therefore, an amount of oxygen dissolved in the liquid film 90 is reduced, and the formation of the watermark can be prevented. Further, since the inert gas is supplied into the drying chamber 71, oxygen is expelled from the drying chamber 71. Therefore, almost no oxygen is dissolved in the liquid film 90 on the wafer W. Further, the oxygen present in the thinner liquid film 90 is replaced with molecules of nitrogen or other element that constitutes the inert gas (i.e., the oxygen is purged from the liquid film 90), so that a concentration of oxygen in the liquid film 90 is further reduced. As a result, the formation of the watermark can be prevented.

Figure 5:
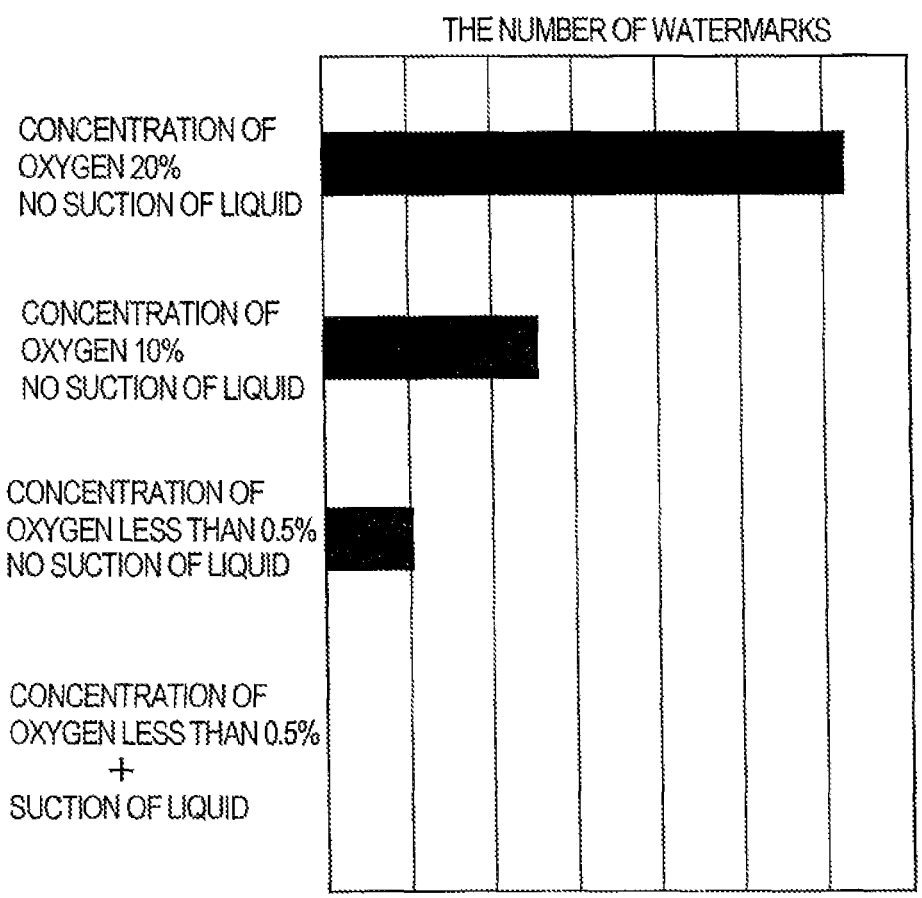
FIG. 5 is a graph showing results of experiments in which watermarks formed on upper surfaces of wafers were counted after the wafers were dried under various conditions.

FIG. 5 is a graph showing results of experiments in which watermarks formed on upper surfaces of wafers were counted after the wafers were dried under various conditions. Vertical axis of FIG. 5 represents wafer drying conditions, and horizontal axis represents the number of watermarks. The concentration of oxygen (its unit is volume percentage) shown in FIG. 5 represents a concentration of oxygen in the drying chamber 71. The experiments were conducted with use of the above-described drying unit 3. In each experiment, while a silicon wafer, with a film of pure water formed on its upper surface, was conveyed in the drying chamber 71, the jet of the inert gas was delivered from the upper inert-gas jet nozzle 75 to the upper surface of the silicon wafer to dry the silicon wafer.

The results of the experiments show the fact that the number of watermarks decreases as the concentration of oxygen in the drying chamber 71 is lowered. However, in the case where the pure water was not sucked from the upper surface of the silicon wafer, the watermarks were observed on the silicon wafer. In contrast, in the case where the pure water was sucked from the upper surface of the silicon wafer while keeping the concentration of oxygen at less than 0.5%, the number of watermarks was almost zero. As can be seen from the results of these experiments, the formation of the watermarks can be prevented by sucking the liquid from the wafer while expelling oxygen from the drying chamber 71 by supplying the inert gas. In order to prevent the formation of the watermarks, the concentration of oxygen in the drying chamber 71 is preferably kept at 0.5% or less (this unit is volume percentage).

Figure 6:
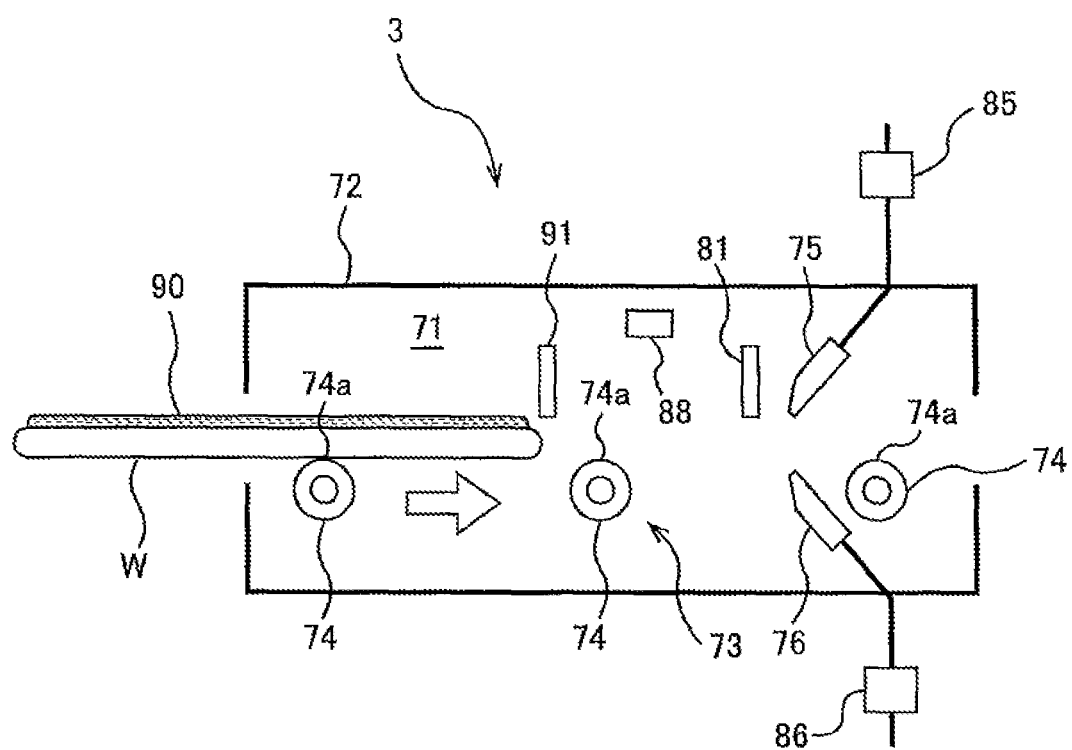
FIG. 6 is a schematic view showing a drying unit which includes an upstream-side liquid suction nozzle and a downstream-side liquid suction nozzle.

From the viewpoint of preventing the formation of the watermarks, it is preferable to remove the liquid on the wafer as quickly as possible. In addition, the thickness of the liquid film 90 on the entirety of the upper surface of the wafer W is preferably kept at not more than a target value (e.g., 2 mm or less) even when the liquid is pushed backward by the jet of the inert gas. From these viewpoints, a plurality of liquid suction nozzles arranged along the conveying direction of the wafer W may be provided. In one embodiment shown in FIG. 6, a liquid suction nozzle 91 is further provided upstream of the liquid suction nozzle 81. In the following descriptions, the liquid suction nozzle 81 will be referred to as downstream-side liquid suction nozzle 81. The upstream-side liquid suction nozzle 91 has the same shape and the same bore as those of the downstream-side liquid suction nozzle 81. A distance between the upstream-side liquid suction nozzle 91 and the upper surface of the wafer W is the same as the distance "d" (see FIG. 2) between the downstream-side liquid suction nozzle 81 and the upper surface of the wafer W.

Figure 7A:
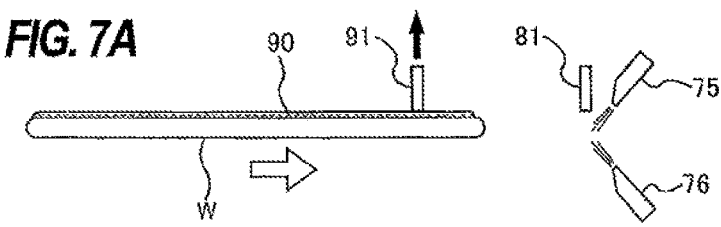
FIG. 7A, FIG. 7B, FIG. 7C, and FIG. 7D are views each showing a manner in which liquid on an upper surface of a wafer is removed by the liquid suction nozzles and a jet of inert gas.
Figure 7B:
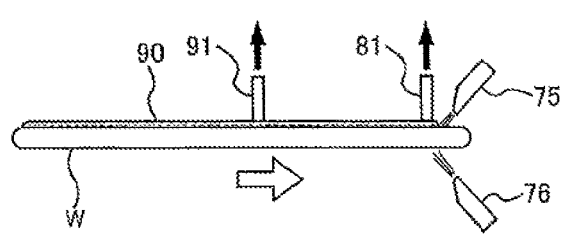

FIGS. 7A through 7D are views each showing a manner in which the liquid on the upper surface of the wafer W is removed by the liquid suction nozzles and the jet of the inert gas. In this embodiment also, in order to fill the drying chamber 71 with the inert gas, the ejection of the inert gas from the inert-gas jet nozzles 75, 76 is started before the wafer W is transported into the drying chamber 71. In FIG. 7A, immediately after the wafer W is transported into the drying chamber 71, the liquid present on the upper surface of the wafer W is sucked by the upstream-side liquid suction nozzle 91, whereby the thickness of the liquid film 90 is reduced. The wafer W is conveyed at a preset speed by the roller conveyer 73. As shown in FIG. 7B, the suction of the liquid by the downstream-side liquid suction nozzle 81 is then started. Immediately after the suction of the liquid by the downstream-side liquid suction nozzle 81 is started, the liquid film 90 is pushed backward by the descending jet of the inert gas formed by the upper inert-gas jet nozzle 75. The ascending jet of the inert gas toward the lower surface of the wafer W is formed by the lower inert-gas jet nozzle 76.

Figure 7C:
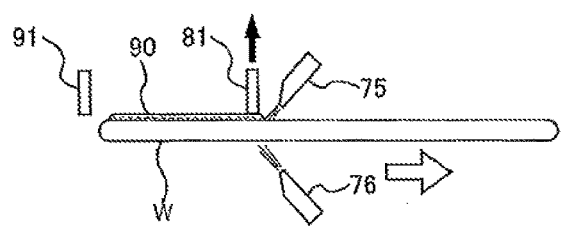
Figure 7D:
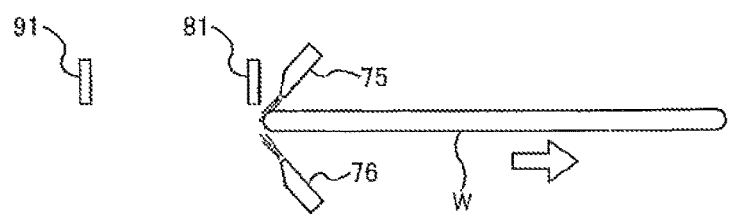

In FIG. 7C, the liquid is sucked by the downstream-side liquid suction nozzle 81 while the descending jet of the inert gas pushes the liquid film 90 backward as the wafer W advances. At this stage, the wafer W has already passed through the upstream-side liquid suction nozzle 91, and the upstream-side liquid suction nozzle 91 no longer sucks the liquid. In FIG. 7D, the entirety of the wafer W passes through the descending jet of the inert gas. As a result, the liquid film 90 is forced out of the upper surface of the wafer W by the descending jet of the inert gas.

According to this embodiment, the two liquid suction nozzles, arranged along the conveying direction of the wafer W, suck the liquid on the wafer W, thus making it possible to quickly suck the liquid from the wafer W that has been transported into the drying chamber 71 and to prevent an increase in the thickness of the liquid film 90 pushed backward by the descending jet of the inert gas. Therefore, the prevention of the formation of the watermark can be ensured.

From the viewpoint of quickly sucking the liquid from the wafer W that has been transported into the drying chamber 71 and the viewpoint of preventing the increase in the thickness of the liquid film 90, a distance between the downstream-side liquid suction nozzle 81 and the upstream-side liquid suction nozzle 91 is preferably one-third to one-half of the diameter of the wafer W. For example, if a wafer diameter is 300 mm, the distance between the downstream-side liquid suction nozzle 81 and the upstream-side liquid nozzle 91 is preferably in a range of 100 mm to 150 mm. The thickness of the liquid film on the wafer W located at the backward of the descending jet of the inert gas is increased by the action of the surface tension of the liquid itself (in particular, at a backward outermost edge). This increase in thickness of the liquid film is reduced by sucking the liquid on the wafer W by the downstream-side liquid suction nozzle 81 in the vicinity of a position in which the film thickness is increased, while the liquid on the wafer W is sucked by the upstream-side liquid suction nozzle 91 disposed upstream with a distance of 100 mm to 150 mm from the downstream-side liquid suction nozzle 81. Therefore, the thickness of the liquid film 90 of the liquid on the wafer W can be easily reduced to a predetermined target value or less (e.g., 2 mm or less). As a result, the increase in the thickness of the liquid film 90 pushed backward by the descending jet of the inert gas can be prevented.

Although the embodiments of the present invention have been described herein, the present invention is not intended to be limited to these embodiments. Therefore, it should be noted that the present invention may be applied to other various embodiments within a scope of the technical concept of the present invention.

What is claimed is:

1. A wafer drying apparatus comprising:
   a conveying mechanism configured to convey a wafer in a drying chamber;
   an inert-gas jet nozzle disposed above the conveying mechanism and configured to form a descending jet of an inert gas, the inert-gas jet nozzle comprising a slit nozzle having a slit;
   a downstream-side liquid suction nozzle disposed upstream of the inert-gas jet nozzle with respect to a conveying direction of the wafer, a distance between the downstream-side liquid suction nozzle and a surface of the wafer when the wafer is being conveyed by the conveying mechanism being in a range of 1 mm to 2 mm, the downstream-side liquid suction nozzle being located on a line extending perpendicularly from a center of the slit; and
   an upstream-side liquid suction nozzle disposed upstream of the downstream-side liquid suction nozzle, a distance between the downstream-side liquid suction nozzle and the upstream-side liquid suction nozzle being one-third to one-half of a diameter of the wafer.

2. The wafer drying apparatus according to claim 1, wherein the liquid suction nozzle has a cylindrical shape.

3. The wafer drying apparatus according to claim 1, wherein the slit nozzle is longer than a diameter of the wafer.

4. The wafer drying apparatus according to claim 1, wherein the inert-gas jet nozzle is inclined at an angle ranging from 45 degrees to 85 degrees with respect to the surface of the wafer when the wafer is being conveyed by the conveying mechanism.

5. The wafer drying apparatus according to claim 1, wherein the inert-gas jet nozzle is located at a distance in a range of 1 mm to 4 mm from the surface of the wafer when the wafer is being conveyed by the conveying mechanism.

6. A wafer drying apparatus comprising:
   a conveying mechanism configured to convey a wafer in a drying chamber in which an inert gas has been supplied;
   an inert-gas jet nozzle disposed above the conveying mechanism and configured to form a descending jet of an inert gas toward the wafer, the inert-gas jet nozzle comprising a slit nozzle having a slit;
   a downstream-side liquid suction nozzle disposed upstream of the inert-gas jet nozzle with respect to a conveying direction of the wafer, a distance between the downstream-side liquid suction nozzle and the inert-gas jet nozzle being in a range of 1 mm to 5 mm, the downstream-side liquid suction nozzle being located on a line extending perpendicularly from a center of the slit; and
   an upstream-side liquid suction nozzle disposed upstream of the downstream-side liquid suction nozzle, a distance between the downstream-side liquid suction nozzle and the upstream-side liquid suction nozzle being one-third to one-half of a diameter of the wafer.

7. A wafer drying method comprising:
   forming a descending jet of an inert gas in a drying chamber;
   sucking a liquid film existing on a surface of a wafer by a downstream-side liquid suction nozzle and an upstream-side liquid suction nozzle, disposed upstream of the downstream-side liquid suction nozzle, to reduce a thickness of the liquid film to 2 mm or less, while conveying the wafer in the drying chamber, a distance between the downstream-side liquid suction nozzle and the upstream-side liquid suction nozzle being one-third to one-half of a diameter of the wafer; and
   pushing the liquid film out of the wafer by the descending jet of the inert gas.

8. The wafer drying method according to claim 7, further comprising:
   keeping a concentration of oxygen in the drying chamber at 0.5% or less.

* * * * *